(12) United States Patent
Natori et al.

(10) Patent No.: US 8,648,888 B2
(45) Date of Patent: *Feb. 11, 2014

(54) IMAGE DISPLAY DEVICE AND METHOD OF MANUFACTURING THE SAME

(75) Inventors: Takehisa Natori, Kanagawa (JP); Yoshimitsu Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 1447 days.

This patent is subject to a terminal disclaimer.

(21) Appl. No.: 11/894,534

(22) Filed: Aug. 21, 2007

(65) Prior Publication Data

US 2008/0043045 A1 Feb. 21, 2008

Related U.S. Application Data

(63) Continuation of application No. 10/468,617, filed as application No. PCT/JP02/12558 on Nov. 29, 2002, now Pat. No. 7,319,471.

(30) Foreign Application Priority Data

Dec. 20, 2001 (JP) .................................. 2001-387361
Mar. 19, 2002 (JP) .................................. 2002-75550

(51) Int. Cl.
*G09G 5/02* (2006.01)

(52) U.S. Cl.
USPC ................................ 345/694; 345/77; 345/88

(58) Field of Classification Search
None
See application file for complete search history.

(56) References Cited

U.S. PATENT DOCUMENTS

| | | | |
|---|---|---|---|
| 4,647,927 A | 3/1987 | Ichikawa et al. | |
| 4,652,912 A | 3/1987 | Masubuchi | |
| 5,113,274 A * | 5/1992 | Takahashi et al. | 349/109 |
| 5,835,269 A | 11/1998 | Natori | |
| 5,936,347 A | 8/1999 | Isaka et al. | |
| 5,990,802 A | 11/1999 | Maskeny | |
| 6,100,861 A * | 8/2000 | Cohen et al. | 345/88 |
| 6,320,209 B1 | 11/2001 | Hata et al. | |
| 6,448,718 B1 | 9/2002 | Battersby | |
| 6,583,774 B1 | 6/2003 | Yoshida et al. | |
| 6,618,031 B1 | 9/2003 | Bohn et al. | |
| 6,803,894 B1 | 10/2004 | Hirota et al. | |
| 6,862,012 B1 * | 3/2005 | Funakoshi et al. | 345/88 |
| 6,877,106 B2 * | 4/2005 | Tomooka et al. | 714/4 |
| 6,975,287 B2 | 12/2005 | Bechtel et al. | |
| 7,319,471 B2 * | 1/2008 | Natori et al. | 345/690 |
| 2002/0126074 A1 | 9/2002 | Ouellette et al. | |

FOREIGN PATENT DOCUMENTS

| | | |
|---|---|---|
| JP | 60-37588 | 2/1985 |
| JP | 62-287285 | 12/1987 |
| JP | 11-149260 | 6/1999 |
| JP | 11-307812 A | 11/1999 |
| JP | 2001-176668 A | 6/2001 |
| JP | 2001-307665 A | 11/2001 |
| JP | 2002-009337 A | 1/2002 |
| WO | WO 01/18779 A1 | 3/2001 |

* cited by examiner

*Primary Examiner* — Seokyun Moon
(74) *Attorney, Agent, or Firm* — Wolf, Greenfield & Sacks, P.C.

(57) ABSTRACT

The present invention relates to an image display device and a method of manufacturing the image display device that make it possible to form pixels with a smaller number of sub-pixels as compared with a case where one pixel is formed so as to separately include one each of sub-pixels of three colors of R, G, and B, and make full-color display by making the sub-pixels emit light by time division. The present invention can provide an image display device that makes it possible to reduce the number of sub-pixels and form pixels at a high density by sharing respective sub-pixels between pixels and displaying the sub-pixels by time division and thus realize high picture quality and reduction in the number of parts.

12 Claims, 11 Drawing Sheets

IMAGE DISPLAY DEVICE AND METHOD OF MANUFACTURING THE SAME

RELATED APPLICATIONS

This application is a Continuation of U.S. application Ser. No. 10/468,617, filed on Aug. 20, 2003, which, in turn, claims priority under 35 U.S.C. 371 and 37 CFR 1.495 to PCT/JP02/12558, filed Nov. 29, 2002, which, in turn, claims priority to Japanese application No. JP2001-387361, filed Dec. 20, 2001, and Japanese application No. JP2002-75550, filed Mar. 19, 2002, all of which are herein incorporated by reference in their entirety.

TECHNICAL FIELD

The present invention relates to an image display device and a method of manufacturing the image display device, and particularly to a high-performance image display device and a method of manufacturing the high-performance image display device that make it possible to reduce the number of sub-pixels and enhance resolution.

BACKGROUND ART

Various display devices have been developed as image display devices of light weight and small thickness. Main categories of such image display devices include, for example, image display devices using light emitting diodes (LEDs), liquid crystal displays (LCDs), plasma display panels (PDPs), field emission displays (FEDs) and the like. An LED display formed by arranging light emitting diodes, in particular, can be used by itself as an image display device, and can also be used as a backlight for a liquid crystal display device.

For full-color LED displays in which light emitting elements emitting colors different from each other are arranged and made to emit light sequentially to display a full-color image, in particular, various techniques for arranging the light emitting elements, light emission procedures and the like are known.

For example, Japanese Patent Laid-Open No. Hei 9-198007 discloses a display device formed such that the numbers of red light emitting pixels, green light emitting pixels, and blue light emitting pixels arranged in a form of a matrix are in a ratio of 1:2:1.

According to Japanese Patent Laid-Open No. Hei 11-133887, pixels are formed such that each pixel has one red sub-pixel, one green sub-pixel, and one blue sub-pixel disposed therein. Specifically, a technique is disclosed in which one pixel is formed by sub-pixels R and G arranged along a first scan electrode, a sub-pixel R arranged along a second scan electrode, and sub-pixels G and B arranged along a third scan electrode, thereby reducing a pixel pitch as compared with a case where three sub-pixels R, G, and B are arranged in one line, and correspondingly increasing display density. Also, a technique is disclosed which makes time-division display by a combination of illumination/non-illumination of these sub-pixels and thereby makes multiple-color display.

In an in-line type image display device where a red sub-pixel emitting a red color, a green sub-pixel emitting a green color, and a blue sub-pixel emitting a blue color are arranged in order in a horizontal direction and sub-pixels arranged in the same pattern as the pattern arranged in the horizontal direction are arranged at equal intervals in a vertical direction, each pixel is formed so as to include one sub-pixel emitting the red color, one sub-pixel emitting the green color, and one sub-pixel emitting the blue color. Hence, pixels are formed as RGB units by the same arrangement of sub-pixels in the horizontal direction, and sub-pixels emitting the same color are arranged in the same column in the vertical direction. By thus arranging sub-pixels and making each of the sub-pixels emit light by time division, an image is displayed. At this time, sub-pixels emitting the same color and arranged in the same column are illuminated, and columns of sub-pixels are illuminated sequentially, whereby the image display can be made.

Conventionally, pixels are formed such that one pixel separately includes one red sub-pixel, one green sub-pixel, and one blue sub-pixel. Therefore, the number of sub-pixels needs to be three times the number of pixels or more, and an image display device in which light emitting elements serving as light sources of an LED display are arranged has a large number of light emitting elements forming sub-pixels. Further, for size reduction and resolution improvement of the image display device, it is important to reduce distance between pixels and arrange light emitting elements at a high density. It has also become important to reduce the number of parts without degrading picture quality as well as reduce the size of the light emitting elements. In addition, in an image display device formed by arranging a large number of light emitting elements at a high density, there may be a case where not all light emitting elements are driven normally. Thus, it is also important to drive light emitting elements with a high reliability and thereby make high-quality image display.

In the meantime, depending on a position of a sub-pixel formed by a light emitting element of a high visibility, the conventional arrangement of sub-pixels may cause a difference between a desired display position of a pixel and a position of the pixel actually perceived by the eye of a person viewing the image.

With decrease in the size of light emitting elements, the number of light emitting elements arranged on a screen is increased. Therefore, the image display device is generally constructed by forming sub-pixels on unit panels, and arranging a plurality of these unit panels in a form of a matrix on a device substrate. In this case, at an edge portion of a unit panel, a part for connection with the substrate of the image display device or the like is required, and hence a certain region having no elements arranged therein is required. It is also important to secure a region for compensating for variations in size of the unit panels and size resulting from thermal expansion. In addition, there is a desire for techniques for easily manufacturing a high-quality image display device by efficiently arranging light emitting elements.

Accordingly, in view of the above problems, it is an object of the present invention to provide an image display device that makes it possible to form pixels with a smaller number of sub-pixels as compared with a case where one pixel is formed so as to separately include one each of sub-pixels of three colors of R, G, and B, and which can make full-color display by making the sub-pixels emit light by time division. It is another object of the present invention to provide an image display device that can secure a region with no light emitting elements arranged therein at an edge of a unit panel without degrading picture quality by thinning out sub-pixels at the edge of the unit panel. It is a further object of the present invention to provide a method of manufacturing an image display device which method makes it possible to manufacture the image display device efficiently.

DISCLOSURE OF THE INVENTION

According to the present invention, a sub-pixel emitting a color of a low visibility among sub-pixels forming an image display device is shared between pixels and made to emit light by time division. It is thereby possible to reduce the number of sub-pixels as compared with a case where each pixel has sub-pixels of three colors separately arranged therein. Further, since the number of sub-pixels can be reduced without degrading picture quality, it is possible to reduce the number of parts, which leads to cost reduction. In this case, by disposing sub-pixels emitting a color of high visibility at centers of pixels and arranging the sub-pixels at equal intervals in a horizontal direction and a vertical direction, pixels appear to be arranged at equal intervals in the horizontal direction and the vertical direction.

Also, even when a sub-pixel is not driven normally, the pixel can be displayed without a problem by driving a sub-pixel that is disposed around the sub-pixel not driven normally and emits the same color as the sub-pixel not driven normally. Further, by providing a light blocking board between sub-pixels, it is possible to block extraneous light and thus make high-contrast image display even outdoors.

In addition, by thinning out sub-pixels disposed at an edge of a unit panel of an image display device formed by arranging unit panels in a form of a matrix, it is possible to secure a certain region with no sub-pixels arranged therein at the edge of the unit panel, and compensate for differences in size of the unit panels and differences in size resulting from thermal expansion. It is further possible to secure a space for forming wiring for connection between unit panels.

Further, by transferring light emitting elements for enlargement and performing the enlargement transfer for each light emitting element of each light emission color, it is possible to arrange elements on a substrate efficiently and thus readily manufacture an image display device.

BEST MODE FOR CARRYING OUT THE INVENTION

First Embodiment

According to a first embodiment, an image display device in which sub-pixels emitting colors different from each other are arranged in a form of a matrix and each pixel is formed by a plurality of sub-pixels is characterized in that: first sub-pixels emitting a color of a highest visibility among the colors are arranged at a predetermined pitch and a second sub-pixel emitting another color is disposed between the first sub-pixels; and each pixel is formed such that the second sub-pixel is shared by adjacent pixels and the sub-pixels are driven such that each pixel is displayed by time division. The image display device according to the first embodiment will hereinafter be described with reference to the drawings.

Figure 1:
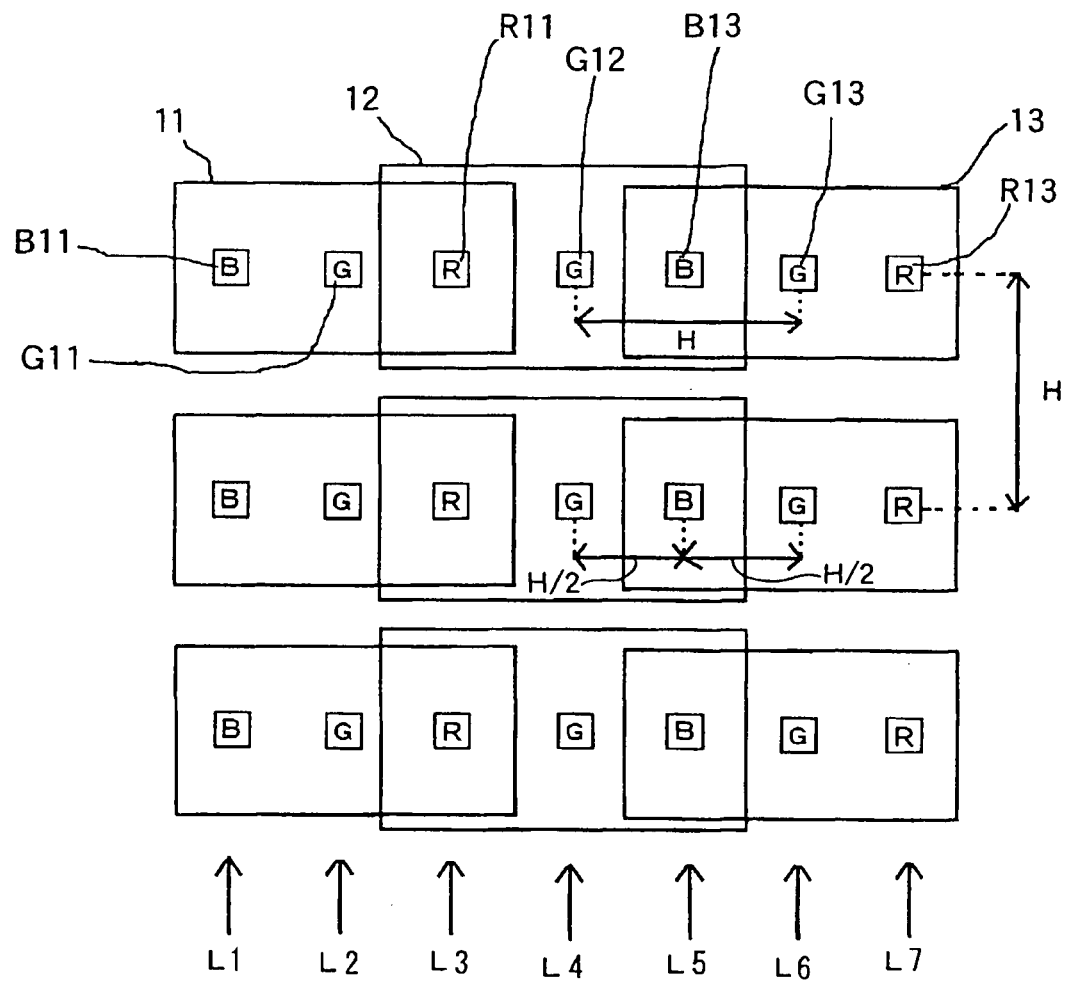
FIG. 1 is a diagram showing an arrangement of sub-pixels of an image display device according to a first embodiment of the present invention, and is a schematic plan structural view showing a plane structure of the image display device.

FIG. 1 is a layout diagram showing a layout of a display in which sub-pixels forming the image display device have light emitting elements. For example, the sub-pixels forming pixels are each formed so as to include one light emitting diode. FIG. 1 shows three pixels in each of a vertical direction and a horizontal direction of an image display surface, sub-pixels emitting a blue color, a green color, and a red color being arranged in a form of a matrix on a substrate, and one pixel being formed with sub-pixels of the three colors as a set. Each of the sub-pixels is formed in one-to-one correspondence with one of light emitting elements arranged on the substrate. The present invention is not limited to the red color, the green color, and the blue color; the sub-pixels emitting the three colors may be a combination that can produce a color display by mixing the three colors. A high-definition full-color display with a wide range of displayable colors can be made particularly by forming a pixel using sub-pixels emitting the red color, the green color, and the blue color, which are the three primary colors of light, as a set.

The light emitting elements forming the image display device according to the first embodiment are not limited to light emitting diodes; an image display device can be provided in which sub-pixels are formed by arranging semiconductor laser elements or other light emitting elements. Further, the present invention is not limited to image display devices using light emitting diodes or semiconductor laser elements; an image display device in which a pixel is formed with sub-pixels of three colors as a set will suffice. For example, the present invention can also be applied to surface light emission type image display devices such as liquid crystal displays (LCDs) comprising sub-pixels emitting light of three colors by changing the wavelength of monochromatic light emitted from a backlight by means of a color filter, plasma display panels (PDPs) using plasma discharge, EL displays comprising EL devices using electroluminescence (EL), field emission displays (FEDs) and the like.

The layout of light emitting elements emitting the three colors and pixels formed by the light emitting elements will first be described in detail. Green light emitting elements (indicated by G in FIG. 1) emitting green light are arranged at a pitch H in the horizontal direction of the image display surface. Blue light emitting elements (indicated by B in FIG. 1) and red light emitting elements (indicated by R in FIG. 1) are arranged alternately between the green light emitting elements at the pitch H so as to interpose the green light emitting elements. In this case, the blue light emitting elements and the red light emitting elements are both arranged at about double the pitch H (H×2) in the horizontal direction.

Further, light emitting elements emitting the same color are arranged at the pitch H in a column in the vertical direction, and columns of the red light emitting elements and the blue light emitting elements are arranged alternately in the horizontal direction so as to sandwich columns of the green light emitting elements. Hence, light emitting elements in an in-line type arrangement arranged in the horizontal direction by a certain rule are also arranged in the vertical direction in the same arrangement of the light emitting elements. In this case, the green light emitting elements emitting the green color of the highest visibility among these blue, green, and red colors are arranged at the pitch H in the vertical direction and the horizontal direction.

A light emitting element emitting the color of the highest visibility among light emitting elements comprising a pixel is disposed at a center of the three light emitting elements comprising one pixel, and the light emitting elements emitting the other colors are disposed on both sides of the light emitting element emitting the color of the highest visibility. One pixel is formed with the light emitting elements of the three colors as one set. In the first embodiment, since the pixel is formed with the sub-pixels of the red light emitting element, the green light emitting element, and the blue light emitting element as one set, the light emitting element emitting the green color of the highest visibility among these three colors is placed at the center of the sub-pixels of the three colors arranged in the horizontal direction. In this case, the blue light emitting elements and the red light emitting elements are arranged alternately between the green light emitting elements arranged at regular intervals in the horizontal direction, and pixels adjacent to each other in the horizontal direction are formed so as to share the blue light emitting elements and the red light emitting elements with each other, rather than individually having one red light emitting element, one green light emitting element, and one blue light emitting element.

Light emitting elements are arranged in the vertical direction at the pitch H so as to be in the same arrangement as the arrangement of the pixels that are arranged in the horizontal direction so as to share the blue light emitting elements and the red light emitting elements arranged on both sides of the green light emitting elements, as described above, and the light emitting elements thus form pixels. In this case, light emitting elements emitting the same color are arranged in the same column in the vertical direction, and are arranged such that intervals of the light emitting elements are substantially the same in the vertical direction.

The present invention is not limited to the arrangement of the light emitting elements in which the light emitting elements of the three colors are arranged in the horizontal direction and among these light emitting elements, the light emitting elements emitting the colors of lower visibilities are shared by the pixels adjacent to each other in the horizontal direction as described above. The pixels may be formed in an arrangement in which the red light emitting elements and the blue light emitting elements are transposed between adjacent rows, in a so-called delta arrangement in which the position in the horizontal direction of the green light emitting elements is shifted by about ½ H between adjacent rows, or in an arrangement in which the arrangement of the light emitting elements in the horizontal direction and the arrangement of the light emitting elements in the vertical direction as described above are transposed. Alternatively, the pixels can be formed so as to share light emitting elements in an oblique direction.

Driving operation for making the above-described light emitting elements emit light by time division for image display will next be described. Of the light emitting elements arranged as in FIG. 1, a blue light emitting element B11, a green light emitting element G11, and a red light emitting element R11 form a pixel 11. The red light emitting element R11, a green light emitting element G12, and a blue light emitting element B13 form a pixel 12 adjacent to the pixel 11 in the horizontal direction. In this case, the pixel 11 and the pixel 12 are formed so as to each have the green light emitting element disposed at the center of the pixel and share the red light emitting element R11. The blue light emitting element B13, a green light emitting element G13, and a red light emitting element R13 form a pixel 13. The pixel 12 and the pixel 13 are formed so as to share the blue light emitting element B13.

First, a time for making one pixel emit light is divided in two, and the light emitting elements of sub-pixels comprising the pixel are made to emit light for only a divided time width. The pixel 11 makes the blue light emitting element B11, the green light emitting element G11, and the red light emitting element R11 emit light simultaneously. Next, the red light emitting element R11 is made to emit light again and at the same time, the green light emitting element G12 and the blue light emitting element B13 are made to emit light. In this case, the pixel 11 is displayed when the blue light emitting element B11, the green light emitting element G11, and the red light emitting element R11 are made to emit light by time division. At this time, it suffices to adjust a light emitting time of each of the light emitting elements according to a color desired to be displayed in the pixel 11. Subsequently, the red light emitting element R11, the green light emitting element G12, and the blue light emitting element B13 are made to emit light by time division, whereby the pixel 12 is displayed. Thus far, the pixel 11 and the pixel 12 have been displayed, and in displaying each of the pixels, the red light emitting element R11 is shared by the pixel 11 and the pixel 12. That is, the light emitting element of one color among the three colors necessary for full-color display is shared by the adjacent pixels and made to emit light by time division, whereby the number of light emitting elements can be reduced.

Further, after the light emission of the blue light emitting element B13 for displaying the pixel 12, the blue light emitting element B13 is made to emit light again, and at the same time, the green light emitting element G13 and the red light emitting element R13 are made to emit light, whereby the pixel 13 is displayed. In displaying both the pixel 12 and the pixel 13, the blue light emitting element B13 is made to emit light by time division, whereby the blue light emitting element B13 is shared by both the pixel 12 and the pixel 13. Thus, one light emitting element of one color among the light emitting elements of the three colors necessary for full-color display of each of the pixel 12 and the pixel 13 is made to emit light by time division, whereby the number of light emitting elements can be reduced. Thus, by sharing the red light emitting elements and the blue light emitting elements between adjacent pixels, it is possible to reduce the number of light emitting elements.

Incidentally, odd-numbered pixels such as the pixel 11, the pixel 13 and the like emit light simultaneously, and even-numbered pixels such as the pixel 12, a subsequent pixel 14 not shown in the figure and the like emit light simultaneously. The green light emitting element G does not need to be made to emit light by time division. In that case, the green light emitting element G needs to be balanced with red and blue light emission by lowering a current value or the like. Also, by reducing peak brightness of the green light emitting element G and driving the green light emitting element G on a non-time division basis in coincidence with timing of time division driving of the red light emitting element R and the blue light emitting element B disposed on the periphery of the green light emitting element G, it is possible to balance the brightness of the green light emitting element G with brightness of the red light emitting element R and the blue light emitting element B and thus display the pixel formed by these light emitting elements. In this case, since current supplied to the green light emitting element G can be reduced, power consumed by the image display device as a whole is unchanged.

In this case, light emitting elements are disposed also in the vertical direction in the same arrangement of the pixel 11, the pixel 12, and the pixel 13, and light emitting elements of the same color are arranged at the pitch H in the vertical direction. Hence, the light emitting elements arranged in the same columns as the light emitting elements comprising the above pixels 11, 12, and 13 emit light in the same timing as the light emitting elements comprising the pixels 11, 12, and 13. In addition to sequential time division emission of light of each row as conventionally, a light emitting element column L1 including the blue light emitting element B11 to a light emitting element column L7 including the red light emitting element R13 repeatedly emit light by time division in the horizontal direction and thereby display an image. While FIG. 1 shows only three pixels in each of the horizontal direction and the vertical direction, light emitting elements of the three colors are arranged on the entire image display surface such that pixels adjacent to each other in the horizontal direction share a light emitting element.

Image display is made as described above. Since the green light emitting elements of the highest visibility among the light emitting elements of the three colors are arranged at the same element pitch H in the horizontal direction and the vertical direction, the center of each pixel is the position of the green light emitting element, and therefore pixels appear to be present at the pitch H in the horizontal direction and the vertical direction. It is thereby possible to make uniform image display.

Furthermore, even when a light emitting element forming a pixel is not illuminated normally, the image display device according to the first embodiment can display the pixel by instead illuminating a light emitting element emitting the same color as the light emitting element not illuminated normally. When the red light emitting element R11 forming the pixel 12 is not illuminated normally, for example, the pixel 12 can be displayed in full color by illuminating a red light emitting element disposed around the red light emitting element R11 in timing in which the red light emitting element R11 should be illuminated. For example, the red light emitting element R13 forming the pixel 13 adjacent to the red light emitting element R11 may be illuminated in place of the red light emitting element R11. By instead illuminating the light emitting element forming the adjacent pixel and emitting light of the same color, it is possible to make image display without degrading image quality. This operation is not limited to the red light emitting element R; even when a blue light emitting element B is not illuminated normally, the pixel can be similarly displayed without a problem by instead illuminating a blue light emitting element B disposed around the blue light emitting element B.

Figure 2:
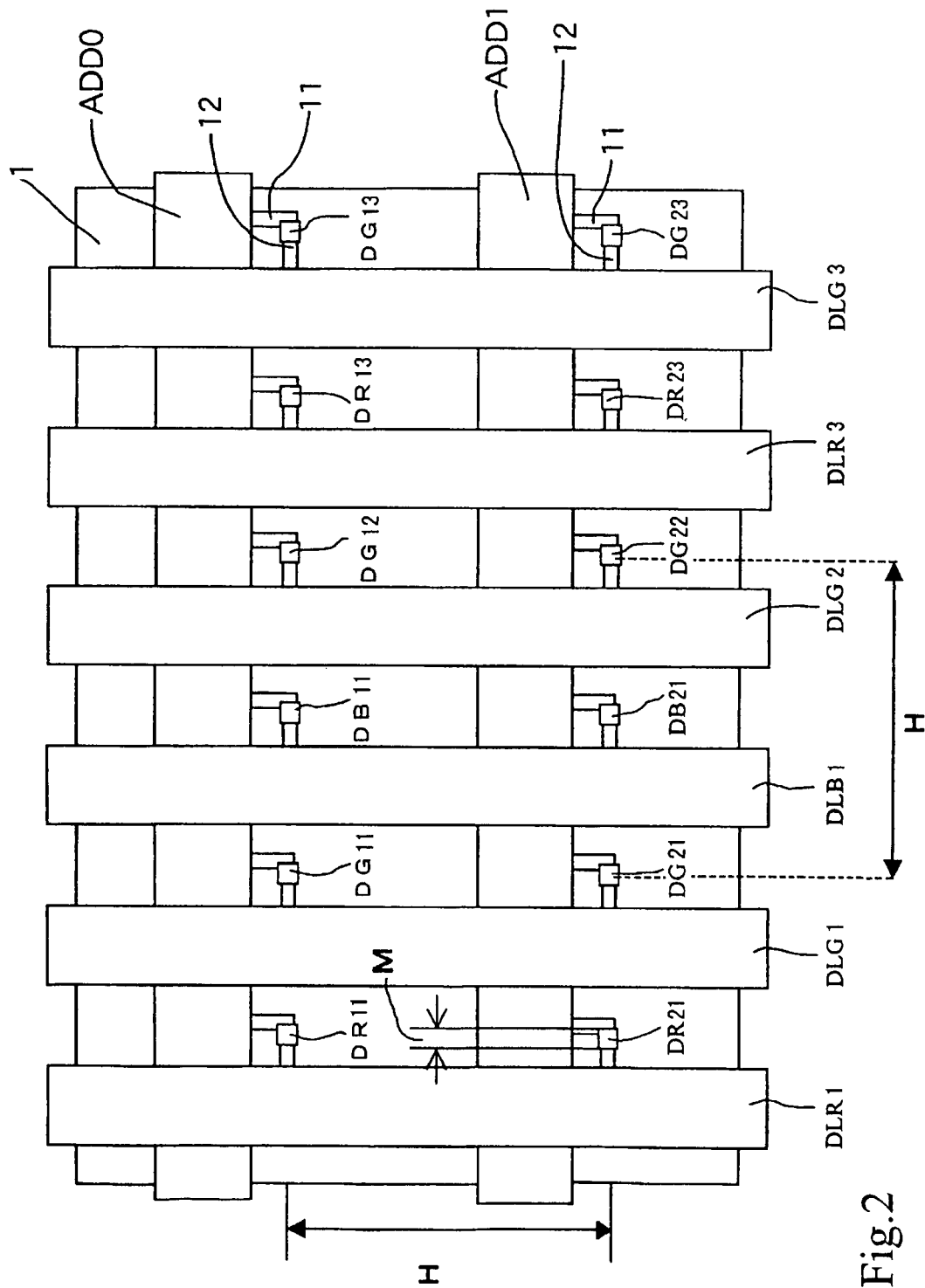
FIG. 2 is a diagram showing an example of wiring of the image display device according to the first embodiment of the present invention.

The light emitting elements arranged as described above and driven by time division are connected to wiring arranged on a substrate to be electrically connected to a driving circuit for driving the light emitting elements. FIG. 2 shows an example of a layout in which the light emitting elements are arranged on the substrate having the wiring arranged thereon. The wiring shown in FIG. 2 indicates a passive matrix type element driving system, and the light emitting elements are arranged so as to correspond to positions of intersection of address lines and data lines. As the light emitting elements, light emitting diodes coated with transparent resin and formed in such a shape as to be handled easily at the time of mounting, for example, can be used.

In the image display device according to the first embodiment, a plurality of address lines ADD0 and ADD1 extending in a horizontal direction on a main surface of a wiring substrate 1 are formed, and a plurality of data lines DLR1 to DLG3 extending in a vertical direction are formed with an interlayer insulating film not shown in the figure interposed between the plurality of address lines ADD0 and ADD1 and the plurality of data lines DLR1 to DLG3. The wiring substrate 1 is for example a glass substrate, a metal substrate coated with a synthetic resin or an insulating layer, or a substrate generally used in semiconductor manufacturing, such as a silicon substrate or the like. The wiring substrate 1 may be any substrate as long as the substrate allows the address lines and the data lines to be formed with required precision.

The positions of the light emitting elements correspond to the positions of intersection of the address lines ADD0 and ADD1 and the data lines DLR1 to DLG3. In this case, the address lines are arranged at a pitch H so that the element pitch H in the horizontal direction of green light emitting elements DG11, DG12, and DG13 and the element pitch in the vertical direction of green light emitting elements represent the same distance. Further, data lines DLR and DLB for electrically connecting red light emitting elements DR and blue light emitting elements DB, respectively, to the driving circuit are disposed alternately with each other between data lines DLG. In this case, the respective pitches of the data lines DLR and DLB are substantially double the horizontal or vertical element pitch H of the green light emitting elements (H×2). Each of the light emitting elements is connected to an address line and a data line by conductive connecting lines 11 and 12, respectively.

The address lines ADD0 and ADD1 are formed by a metallic material layer having excellent conductivity, a combination of a semiconductor material layer and a metallic material layer or the like. The line width of the address lines ADD0 and ADD1 can be made wider than a size M of a light emitting element, as shown in FIG. 2. It is therefore possible to minimize delay caused by resistance of the address lines themselves when pixels are sequentially scanned to output a required image. The address lines ADD0 and ADD1 extend in the horizontal direction, and one address line passes per pixel. Thus, pixels adjacent to each other in the horizontal direction selectively use a common address line.

As with the address lines, the data lines DLR1 to DLG3 are formed by a metallic material having excellent conductivity, a combination of a semiconductor material layer and a metallic material layer or the like. The line width of the data lines DLR1 to DLG3 can be formed so as to occupy about half of an area occupied by the wiring substrate 1, as shown in FIG. 2. The data lines DLR1 to DLG3 extend in the vertical direction, and three data lines are used according to the number of light emitting elements per pixel. In this case, since red light emitting elements and blue light emitting elements are shared by adjacent pixels, the number of data lines can also be reduced as compared with a case where a red light emitting element, a green light emitting element, and a blue light emitting element are arranged separately in each pixel. For example, while a red light emitting element DR11 at the upper left of FIG. 2, a green light emitting element DG11, and a blue light emitting element DB11 comprise one pixel and the data lines DLR1 to DLG3 are provided for each color of light emission, a pixel comprising the blue light emitting element DB11, DG12, and DR13 uses the data lines DLB1, DLG2, and DLR3 as data lines, and light emitting elements emitting light of the same color of pixels adjacent to each other in the vertical direction use a common data line.

In the image display device according to the first embodiment, the pixel pitch in the vertical direction is H and the pitch of the green light emitting elements in the horizontal direction is also H. The pitch can be set in a range of 0.1 mm to 1 mm, for example. This is because an appropriate diagonal size of image display devices for moving images (television receivers, video apparatus, and game apparatus) and for information (for computers, for example) is 30 cm to 150 cm, it is desirable from a practical viewpoint that the image display devices have a number of pixels of approximately three hundred thousand to two million when an RGB combination forms one pixel, and it is also desirable from a viewpoint of characteristics of human vision that a direct view type image display device have a pixel pitch of 0.1 mm (high-definition display for individual use) to 1 mm (moving image display for use by several people). When the image display device according to the first embodiment is used for large screen display for outdoor use, the pitch can be set to about 10 mm. By using minute light emitting elements as compared with conventional light emitting elements of a size of a few mm, it is possible to increase space between elements and thus readily route wiring arranged between elements.

As the light emitting elements of the first embodiment, light emitting diodes, which are self-luminous type light emitting elements, can be used. For example, a gallium nitride based double hetero structure multilayer crystal grown on a sapphire substrate can be used as a blue and a green light emitting diode. The light emitting diodes emitting blue and green light can be formed of a semiconductor layer crystal-grown by selective growth from a substrate whose main surface is substantially a C-surface as with a sapphire substrate and having an inclined crystal surface inclined with respect to the main surface of the substrate. Further, when the light emitting diodes are formed of a nitride semiconductor layer whose inclined crystal surface is similar to an S-surface, high-quality light emitting diodes can be formed. As a red light emitting diode, an aluminum gallium arsenide based or indium aluminum gallium phosphide based double hetero structure multilayer crystal grown on a gallium arsenide substrate can be used. While the light emitting diodes form a pixel that comprises a set of light emitting elements of three colors of wavelengths different from each other, the set of different wavelengths is not limited to red, green, and blue, and may be a set of other colors.

These light emitting diodes each have a substantially square shape, for example, and have a chip structure mounted in a non-package state or a minute package state (about 1-mm size or less, for example). Though details of a layer structure of the light emitting diodes are not shown, each of the light emitting diodes has a substantially square plane shape, and a matrix arrangement of the light emitting diodes is formed by mounting the light emitting diode chips of the substantially square shape.

Each of the light emitting diodes of the substantially square shape can be about 5 μm to 100 μm in size of one side thereof, for example. As a light emitting diode of such a minute size for mounting on the wiring substrate, each of the light emitting diodes is mounted on the wiring substrate in the minute package state or the non-package state.

Each of the light emitting diodes mounted with the minute size has the size as described above. Each of the light emitting diodes is formed on an element forming substrate, then separated into each chip, and mounted in the non-package state or the minute package state. The non-package state refers to a state in which treatment for coating the outside of the diode chip, such as resin formation or the like, is not performed. The minute package state refers to a state in which the light emitting diode is coated with a resin or the like of a small thickness and is housed in a package of a size (about 1 mm or less, for example) smaller than a normal package size. Since the light emitting diodes used in the image display device according to the first embodiment have no package or a minute package, the light emitting diodes are mounted on the wiring substrate with a correspondingly minute size.

Each of the light emitting diodes is electrically connected to an address line via an electrode pad unit connected to the address line, and is similarly electrically connected to a data line via an electrode pad unit connected to the data line. Each of the light emitting diodes is electrically connected to the address line and the data line via the electrode pad units, and is driven by a time division system.

The present invention is not limited to such a driving system. For example, the light emitting elements can also be driven by an active matrix driving system by temporally dividing an image display period and sequentially applying voltage to the light emitting elements to be driven in the divided time units. Further, by connecting a current retaining circuit to each of the light emitting elements, it is possible to make the light emitting elements emit light for a longer time and thereby increase brightness of the image as a whole. In this case, especially because the light emitting elements used in the first embodiment are of a minute size, sufficient space for arranging complex wiring and a large number of driving elements can be secured on the substrate.

Second Embodiment

According to a second embodiment, an image display device in which sub-pixels emitting colors different from each other are arranged in a form of a matrix and each pixel is formed by a plurality of sub-pixels is characterized in that: first sub-pixels emitting a color of a highest visibility among the colors are arranged at a predetermined pitch and a second sub-pixel emitting another color is disposed between the first sub-pixels; each pixel is formed such that the second sub-pixel is shared by adjacent pixels and the sub-pixels are driven such that each pixel is displayed by time division; and light blocking means for blocking extraneous light is disposed.

Since the image display device according to the second embodiment is provided with the light blocking means between pixels, extraneous light is not reflected by an image display surface. The image display device according to the second embodiment is therefore suitable especially for outdoor use. Thus, the image display device is provided with minute light emitting elements and is able to make high-contrast image display, and also when the image display device is used outdoors, an image displayed is not difficult to see, so that the image display device can make high-quality image display.

Figure 3:
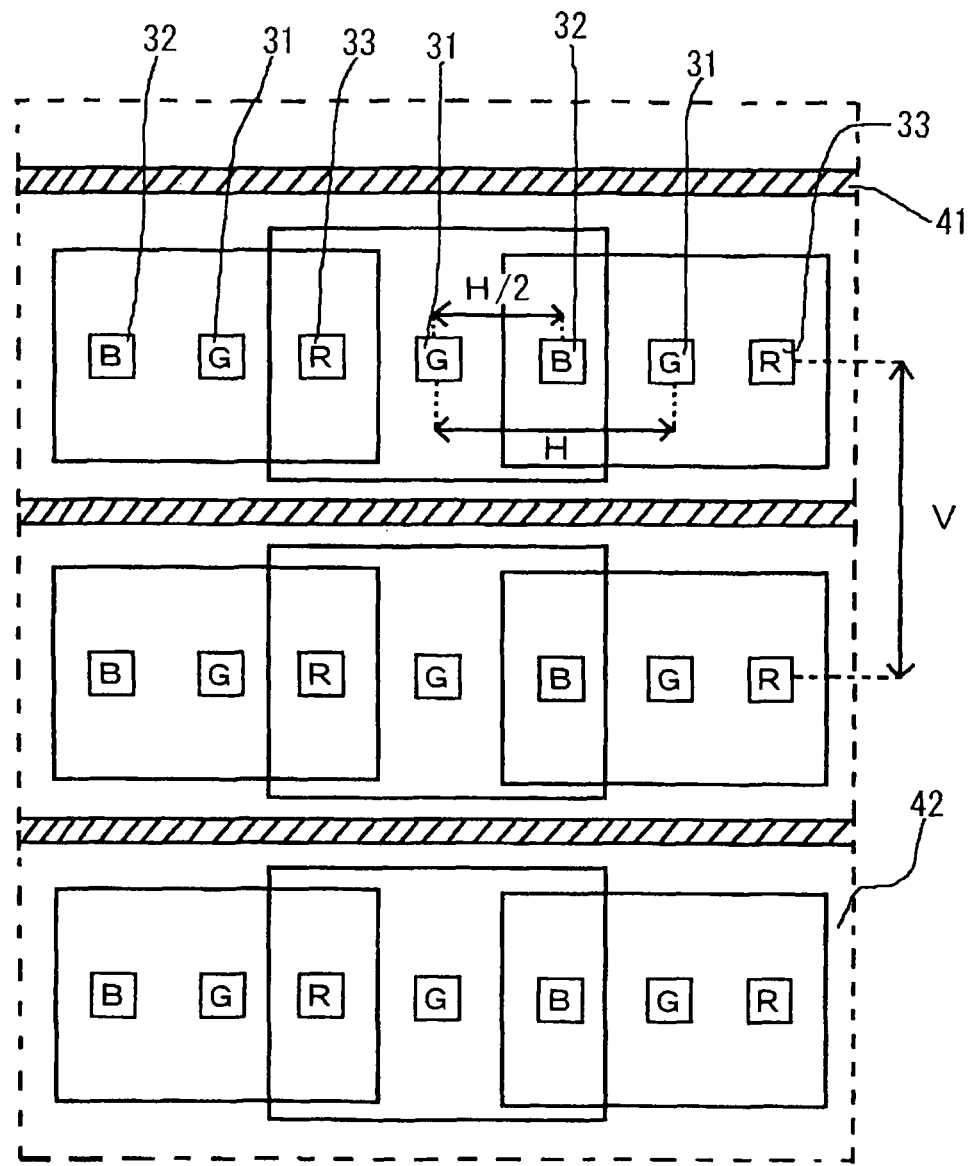
FIG. 3 is a diagram showing an arrangement of light blocking boards of an image display device according to a second embodiment of the present invention, and is a schematic plan structural view showing a plane structure of the image display device.

As shown in FIG. 3, in a horizontal direction of the image display device according to the second embodiment, green light emitting elements 31 (indicated by G in FIG. 3) forming sub-pixels emitting green light are arranged at a pitch H on a substrate 42 where wiring not shown in the figure is disposed. Blue light emitting elements 32 emitting blue light (indicated by B in FIG. 3) and red light emitting elements 33 emitting red light (indicated by R in FIG. 3) are arranged alternately between the green light emitting elements 31. In this case, the red light emitting elements 33 and the blue light emitting elements 32 are both arranged at double the pitch H in the horizontal direction.

Further, light emitting elements emitting the same color are arranged at the pitch H in the vertical direction, and sub-pixels emitting the same color are arranged in a column in the vertical direction. In this case, the green light emitting elements 31 of the highest visibility among the light emitting elements of these three colors are arranged at the pitch H in the vertical direction and the horizontal direction. Thus, the blue light emitting elements 32 and the red light emitting elements 33 are arranged alternately in the horizontal direction between the green light emitting elements 31, and light emitting elements emitting the same color are arranged in the vertical direction, thereby forming the image display device.

Each of the light emitting elements of these three colors forms a sub-pixel, and each pixel is formed with a red light emitting element 33, a green light emitting element 31, and a blue light emitting element 32 as one set. In this case, the blue light emitting elements 32 and the red light emitting elements 33 are arranged alternately in the horizontal direction between the green light emitting elements 31, one pixel is formed with a red light emitting element 33, a green light emitting element 31, and a blue light emitting element 32 as one set, and pixels adjacent to each other in the horizontal direction are formed so as to share a blue light emitting element 32 or a red light emitting element 33 with each other. A light emitting element emitting light of the color of the highest visibility among light emitting elements comprising a pixel is disposed at a center of the three light emitting elements comprising one pixel, and the sub-pixels emitting the other colors are disposed on both sides of the light emitting element emitting light of the color of the highest visibility, whereby one pixel is formed. In the second embodiment, since a pixel is formed with light emitting elements emitting red, green, and blue light as one set, the green light emitting element of the highest visibility among the light emitting elements of these three colors is disposed at a center of arrangement of the light emitting elements of the three colors. Light emitting elements of the same colors as those of the light emitting elements arranged such that a sub-pixel is shared between pixels adjacent to each other in the horizontal direction as described above are arranged in the vertical direction. In this case, light emitting elements emitting the same color are arranged in the same column in the vertical direction, and light emitting elements are arranged such that intervals in the vertical direction of the light emitting elements are substantially the same in all columns. The green light emitting elements of the highest visibility are arranged at the same pitch H in the vertical direction and the horizontal direction.

By making these light emitting elements emit light by time division, high-quality image display can be made with a smaller number of light emitting elements as compared with a case where a pixel separately has a red light emitting element, a green light emitting element, and a blue light emitting element. Specifically, a blue light emitting element or a red light emitting element is shared by pixels adjacent to each other in the horizontal direction, and is made to emit light by time division, whereby the blue light emitting element or the red light emitting element can be used for image display of both the adjacent pixels.

Further, in the image display device according to the second embodiment, the light blocking means for blocking extraneous light is disposed so as to extend in the horizontal direction, thereby enabling high-quality image display even outdoors. A light blocking board, for example, suffices as the light blocking means. By utilizing the fact that the space between light emitting elements arranged in the vertical direction is wider, or substantially twice the space between light emitting elements arranged in the horizontal direction and providing a light blocking board of a required height in the space between the light emitting elements arranged in the vertical direction, it is possible to block extraneous light without narrowing a vertical viewing angle. Even when a view of the light emitting elements starts to be obstructed by the light blocking board, the three colors of red, green, and blue become dark simultaneously, and therefore no color change occurs.

Figure 4:
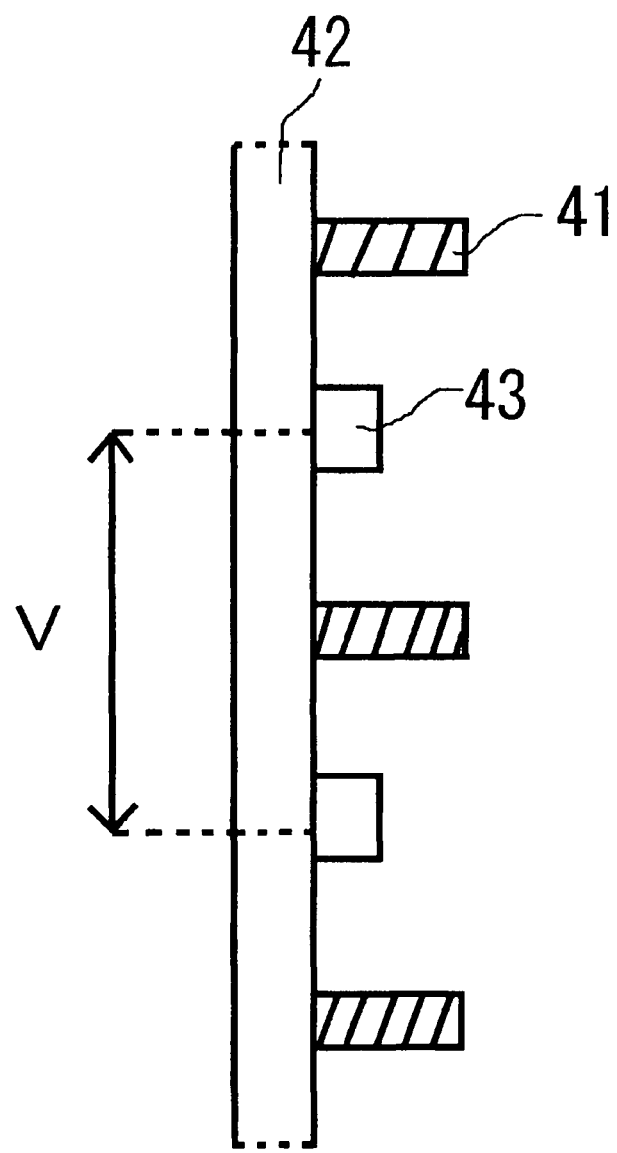
FIG. 4 is a diagram showing an arrangement of light blocking boards of the image display device according to the second embodiment of the present invention, and is a schematic sectional structural view showing a sectional structure of the image display device.

FIG. 4 is a schematic sectional view of a structure of the image display device according to the second embodiment. Light emitting elements are arranged in a vertical direction of the page of FIG. 4. Light blocking board 41 means for blocking extraneous light are disposed between light emitting elements 43 arranged at a pitch in the vertical direction. These light blocking means are disposed so as to extend in parallel with the light emitting elements arranged in the vertical direction of the page of FIG. 4, and are disposed so as to extend from an edge to another edge of the image display surface on which the light emitting elements 43 are arranged. When the image display device is used to make image display outdoors, the image display device is generally irradiated with illumination light or natural light from above the image display device in many cases. Therefore, by disposing the light blocking means only on an upper side of each pixel, image display can be made without lowering contrast. In this case, the light blocking board is formed of a material that does not have a light transmitting property.

As a light emitting element forming a sub-pixel, a light emitting diode can be used, for example. Since the light emitting diode can be formed with a minute element size of about 5 μm to 100 μm as compared with a conventional package of a size of about a few millimeters, it is possible to obtain sufficient space between light emitting elements in the horizontal direction and a sufficient pitch in pixel columns in the vertical direction. A pitch V of light emitting elements in the vertical direction can be set to about 1 cm, for example, so that a light blocking board sufficient to block light can be disposed. It suffices for the light blocking means to have such a height as to be able to suppress reflection on the image display surface without lowering the contrast of the light emitting elements. In this case, by setting the element pitch H in the horizontal direction of the green light emitting elements of the highest visibility among the light emitting elements of the red, green, and blue colors equal to the element pitch V in the vertical direction, pixels appear to be arranged at equal intervals in the horizontal direction and the vertical direction, and therefore excellent image quality can be provided.

As a blue and a green light emitting diode as a light emitting element used for the second embodiment, a gallium nitride based double hetero structure multilayer crystal grown on a sapphire substrate can be used, for example. The light emitting diodes emitting blue and green light can be formed of a semiconductor layer crystal-grown by selective growth from a substrate whose main surface is substantially a C-surface as with a sapphire substrate and having an inclined crystal surface inclined with respect to the main surface of the substrate. Further, when the light emitting diodes are formed of a nitride semiconductor layer whose inclined crystal surface is similar to an S-surface, high-quality light emitting diodes can be formed. As a red light emitting diode, an aluminum gallium arsenide based or indium aluminum gallium phosphide based double hetero structure multilayer crystal grown on a gallium arsenide substrate can be used.

Since the size of the light emitting elements can be set to about 5 μm to 100 μm and these light emitting elements have sufficient brightness and reliability, the pitch in the horizontal direction of the light emitting elements can be made substantially equal to that in the vertical direction. Thus, by arranging the light emitting elements emitting light of the highest visibility among the light emitting elements of the three colors forming the pixels at substantially the same pitch in both of the horizontal direction and the vertical direction, the pixels are arranged at substantially the same pitch in the horizontal direction and the vertical direction, and these pixels appear to be arranged at equal intervals in the horizontal direction and the vertical direction on the display surface.

Thus, by using the image display device according to the second embodiment, it is possible to suppress reflection of extraneous light by the image display surface outdoors and by using light emitting diodes with a high luminous efficiency, it is possible to make high-quality image display. Further, by sharing light emitting elements between adjacent pixels and making the light emitting elements emit light by time division, it is possible to make high-quality image display with a smaller number of light emitting elements.

Third Embodiment

According to a third embodiment, an image display device formed by arranging, in a form of a matrix, unit panels in which sub-pixels emitting colors different from each other are formed is characterized in that: a sub-pixel emitting a specific color is shared between inside pixels or adjacent unit panel pixels, and the sub-pixel emitting the specific color is driven by time division.

The image display device is formed by arranging unit panels, on which light emitting elements forming sub-pixels are arranged, in a form of a matrix on a device substrate. In this case, each of the unit panels is arranged on the device substrate and provided with wiring not shown in the figure for electric connection with a driving circuit for making the light emitting elements emit light. By forming the image display device by arranging unit panels such as the above unit panels, yield in a manufacturing process can be improved as compared with a case where the whole of an image display device is formed by one unit panel because a defect can be corrected only by replacing the defective unit panel. In addition, when a large-screen image display device is fabricated, an image display device of a desired size can be fabricated by placing a plurality of fabricated divided unit panels.

Figure 5:
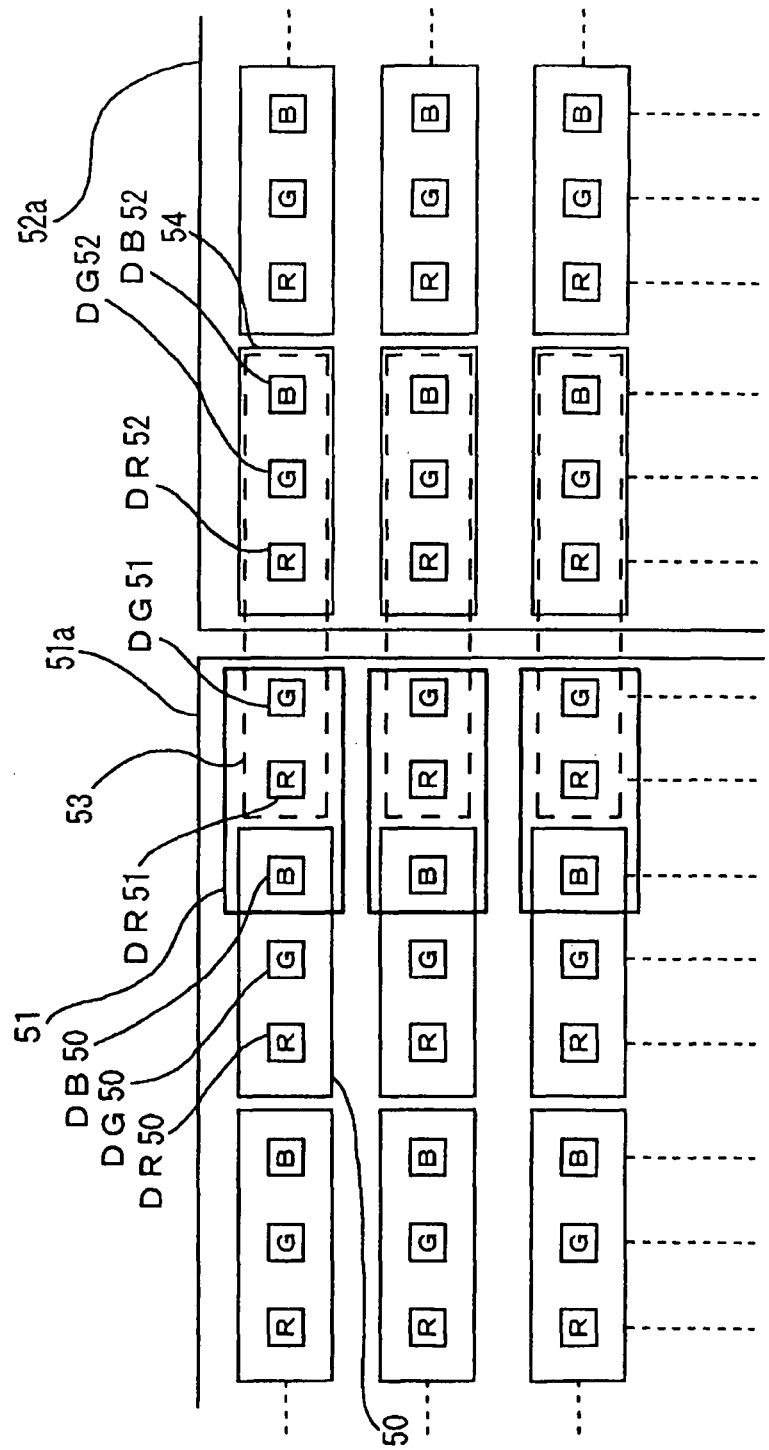
FIG. 5 is a diagram showing adjacent parts of adjacent unit panels of an image display device according to a third embodiment of the present invention, and is a schematic plan structural view showing a plane structure of the image display device.

As shown in FIG. 5, the image display device according to the third embodiment is formed by arranging unit panels in a form of a matrix on a device substrate on which unit panels pixels are arranged in a form of a matrix. Sub-pixels respectively comprise red light emitting elements (indicated by R in FIG. 5), green light emitting elements (indicated by G in FIG. 5), and blue light emitting elements (indicated by B in FIG. 5). These light emitting elements are arranged in the form of a matrix. A red light emitting element, a green light emitting element, and a blue light emitting element are arranged in that order in a horizontal direction, and these three light emitting elements make one set to form one pixel. Light emitting elements emitting light of the same color are disposed at the same pitch in a vertical direction, and thus a light emitting element column in which the light emitting elements of the same color are disposed is formed in the vertical direction.

In this case, at an edge in the horizontal direction of a unit panel 51*a*, light emitting elements are not arranged such that a red light emitting element, a green light emitting element, and a blue light emitting element form one set; only a red light emitting element DR51 and a green light emitting element DG51 are arranged and a blue light emitting element for forming one pixel is thinned out. Light emitting elements emitting light of the same colors are disposed at the same pitch in the vertical direction.

On the other hand, at an edge on a side adjacent to the unit panel 51*a* of a unit panel 52*a* disposed so as to adjoin the unit panel 51*a*, a pixel is formed such that three light emitting elements of a red light emitting element, a green light emitting element, and a blue light emitting element form one set, and similarly a red light emitting element, a green light emitting element, and a blue light emitting element are arranged in that order in the horizontal direction so that the light emitting elements of the three colors make one set to form a pixel. In this case, at an edge of the unit panel 52*a* which edge is not adjacent to the unit panel 51*a*, only a red light emitting element and a green light emitting element are arranged and thus the light emitting elements are arranged in the same arrangement as the arrangement of the light emitting elements arranged at the edge of the unit panel 51*a* which edge adjoins the unit panel 52*a*, rather than forming a pixel with three light emitting elements of a red light emitting element, a green light emitting element, and a blue light emitting element as one set. Light emitting elements emitting light of the same colors are disposed at the same pitch in the vertical direction.

These light emitting elements of the three colors emit light by time division, whereby pixels formed by the light emitting elements of the three colors are displayed.

Display of pixels by light emitting elements arranged at the edge of the unit panel 51*a* which edge adjoins the unit panel 52*a* will now be described in detail. Since only the red light emitting element DR51 and the green light emitting element DG51 are arranged at the edge of the unit panel 51*a*, the two light emitting elements alone cannot form one pixel for enabling full-color display.

The three light emitting elements of a red light emitting element, a green light emitting element, and a blue light emitting element are arranged in a second pixel from the edge of the unit panel 51*a*. These three light emitting elements can be used as one set to form one pixel for enabling full-color display. Hence, the red light emitting element DR51 and the green light emitting element DG51 form one set with the blue light emitting element DB50 disposed in the second pixel from the edge of the unit panel 51*a*, whereby one pixel is formed. Accordingly, description will be made of a method of driving the pixel 51 formed by the red light emitting element DR51, the green light emitting element DG51, and the blue light emitting element DB50 and the pixel 50 formed by the red light emitting element DR50, the green light emitting element DG50, and the blue light emitting element DB50.

First, the red light emitting element DR50, the green light emitting element DG50, and the blue light emitting element DB50 forming the pixel 50 are made to emit light simultaneously to display the pixel 50. Then, the red light emitting element DR51, the green light emitting element DG51, and the blue light emitting element DB50 are made to emit light. By using the blue light emitting element DB50 as the blue light emitting element forming the pixel 51, the pixel 51 can be displayed. Pixels other than those at the edge do not need to be driven by time division, but in such a case, it is necessary to attain a balance by lowering current values. Of course, time division driving may be performed with the same current values. In this case, full-color display of each pixel is made possible by adjusting a time for making each light emitting element emit light.

At this time, the green light emitting elements of the light emitting elements forming the pixel 50 and the pixel 51 emit light of the color of the highest visibility, whereby the centers of the pixel 50 and the pixel 51 appear to be the positions of the green light emitting elements DG50 and DG51, respectively. In this case, an element interval between the red light emitting element DR51 and the green light emitting element DG51 of the light emitting elements forming the pixel 51 differs from an element interval between the green light emitting element DG51 and the blue light emitting element DB50. However, because the light emission color of the blue light emitting element is lower in visibility than the light emission color of the green light emitting element, the displacement of the pixel caused by the different element intervals is hardly noticeable.

Further, a pixel can be similarly formed without disposing a blue light emitting element at the other edge of the unit panel 52a by sharing a blue light emitting element disposed in a second pixel from the edge of the adjacent unit panel. When the image display device is formed by arranging unit panels having light emitting elements arranged thereon, the sharing of a light emitting element between adjacent unit panels makes it possible to widen a space between unit panels and also reduce the number of light emitting elements used for image display as compared with a case where one pixel is formed by separately arranging light emitting elements of the three colors. While in the third embodiment, description is made of a case where a light emitting element is shared between unit panels adjacent to each other in the horizontal direction, the third embodiment is not limited to the horizontal in-line type arrangement in which light emitting elements of the three colors are arranged in order in the horizontal direction. In a case of a vertical in-line type arrangement in which light emitting elements of the three colors are arranged in order in the vertical direction, a light emitting element can be shared between unit panels disposed adjacent to each other in the vertical direction. Further, even in a case of an oblique in-line type arrangement of light emitting elements, pixel display can be made by sharing a light emitting element between adjacent unit panels and effecting light emission by time division.

As another example, display of pixels by light emitting elements arranged at adjacent edges of the unit panel 51a and the unit panel 52a disposed adjacent to the unit panel 51a will now be described in detail. Since only the red light emitting element DR51 and the green light emitting element DG51 are arranged at the edge of the unit panel 51a, the two light emitting elements alone cannot form one pixel for enabling full-color display. The three light emitting elements of a red light emitting element, a green light emitting element, and a blue light emitting element are arranged at the edge of the unit panel 52a. These three light emitting elements can be used as one set to form one pixel for enabling full-color display.

Hence, the red light emitting element DR51 and the green light emitting element DG51 form one set with the blue light emitting element DB52 disposed at the edge of the unit panel 52a, whereby one pixel is formed. Accordingly, description will be made of a method of driving the pixel 53 formed by the red light emitting element DR51, the green light emitting element DG51, and the blue light emitting element DB52 and the pixel 54 formed by the red light emitting element DR52, the green light emitting element DG52, and the blue light emitting element DB52.

First, the red light emitting element DR52, the green light emitting element DG52, and the blue light emitting element DB52 forming the pixel 54 are made to emit light simultaneously to display the pixel 54. Then, the red light emitting element DR51 and the green light emitting element DG51 are made to emit light simultaneously, and the blue light emitting element DB52 is also made to emit light again simultaneously. By using the blue light emitting element DB52 as the blue light emitting element forming the pixel 53, the pixel 53 can be displayed. In this case, full-color display of each pixel is made possible by adjusting a time for making each light emitting element emit light.

At this time, the green light emitting elements of the light emitting elements forming the pixel 53 and the pixel 54 emit light of the color of the highest visibility, whereby the centers of the pixel 53 and the pixel 54 appear to be the positions of the green light emitting elements DG51 and DG52, respectively. In this case, an element interval between the red light emitting element DR51 and the green light emitting element DG51 of the light emitting elements forming the pixel 53 differs from an element interval between the green light emitting element DG51 and the blue light emitting element DB52. However, because the light emission color of the blue light emitting element is lower in visibility than the light emission color of the green light emitting element, the displacement of the pixel caused by the different element intervals is hardly noticeable.

Further, a pixel can be similarly formed without disposing a blue light emitting element at the other edge of the unit panel 52a by sharing a blue light emitting element disposed at an edge of an adjacent unit panel. When the image display device is formed by arranging unit panels having light emitting elements arranged thereon, the sharing of a light emitting element between adjacent unit panels makes it possible to reduce the number of light emitting elements used for image display as compared with a case where one pixel is formed by separately arranging light emitting elements of the three colors. While in the third embodiment, description is made of a case where a light emitting element is shared between unit panels adjacent to each other in the horizontal direction, the third embodiment is not limited to the horizontal in-line type arrangement in which light emitting elements of the three colors are arranged in order in the horizontal direction. In a case of a vertical in-line type arrangement in which light emitting elements of the three colors are arranged in order in the vertical direction, a light emitting element can be shared between unit panels disposed adjacent to each other in the vertical direction. Further, even in a case of an oblique in-line type arrangement of light emitting elements, pixel display can be made by sharing a light emitting element between adjacent unit panels and effecting light emission by time division. Further, with a reduced type sharing red and blue sub-pixels, the blue color at the edge may be omitted and ¼ time division may be performed.

Fourth Embodiment

A method of manufacturing an image display device which method is applied to manufacturing of an image display device according to the present invention will next be described. According to a fourth embodiment, a method of manufacturing an image display device, the image display device having light emitting elements emitting different colors arranged in a form of a matrix, is characterized by comprising: a first transfer step for transferring the light emitting elements so as to bring the light emitting elements into a more widely spaced state than a state of the light emitting elements arranged on the first substrate, and making a temporary holding member hold the light emitting elements; and a second transfer step for spacing the light emitting elements held by the temporary holding member more widely and transferring the light emitting elements onto the second substrate; wherein at the second transfer step, the light emitting elements are detached from the temporary holding member by laser ablation by irradiation with laser light from an undersurface side of the temporary holding member and element suction by vacuum suction.

In the above-described method of manufacturing an image display device, after minute light emitting elements are formed at a high density on an element forming substrate, the light emitting elements can be mounted at a predetermined pitch on a wiring substrate. At this time, the minute light emitting elements can be embedded in a resin or the like to thereby facilitate handling. In the method of manufacturing an image display device according to the fourth embodiment, the minute light emitting elements are re-formed into larger display elements with insulative material, and thereby ease of handling can be greatly improved. Utilizing this feature, it is possible to perform enlargement transfer of the light emitting elements and thus manufacture an image display device. The method of manufacturing a display device will be described in the following by taking a two-stage enlargement transfer method as an example.

First, the two-stage enlargement transfer is performed in which the light emitting elements formed on the first substrate with a high degree of integration are transferred onto the temporary holding member so as to be in a more widely spaced state than a state of the light emitting elements arranged on the first substrate, and then the elements held by the temporary holding member are spaced more widely and transferred onto the second substrate. It is to be noted that while the two-stage transfer is made in this example, the transfer can be made in three stages or more according to a degree of enlargement in spacing and arranging the elements.

Further, by forming the light emitting elements emitting light of the different colors on separate first substrates, spacing the light emitting elements of the different colors at a predetermined element pitch, and sequentially transferring the light emitting elements onto the second substrate, it is possible to arrange the light emitting elements emitting the light of the different colors at the predetermined element pitch.

Also, while the drawings used in the following show only one light emitting element (light emitting diode) included in a resin-formed chip, it is possible to form a plurality of light emitting diodes at a predetermined element pitch in each resin-formed chip and connect each of the light emitting diodes with wiring for image display. When forming a color LED display, for example, it is possible to provide a plurality of light emitting diodes for each color and thus provide nine light emitting diodes including three pieces for each three colors, for example.

Figure 6:
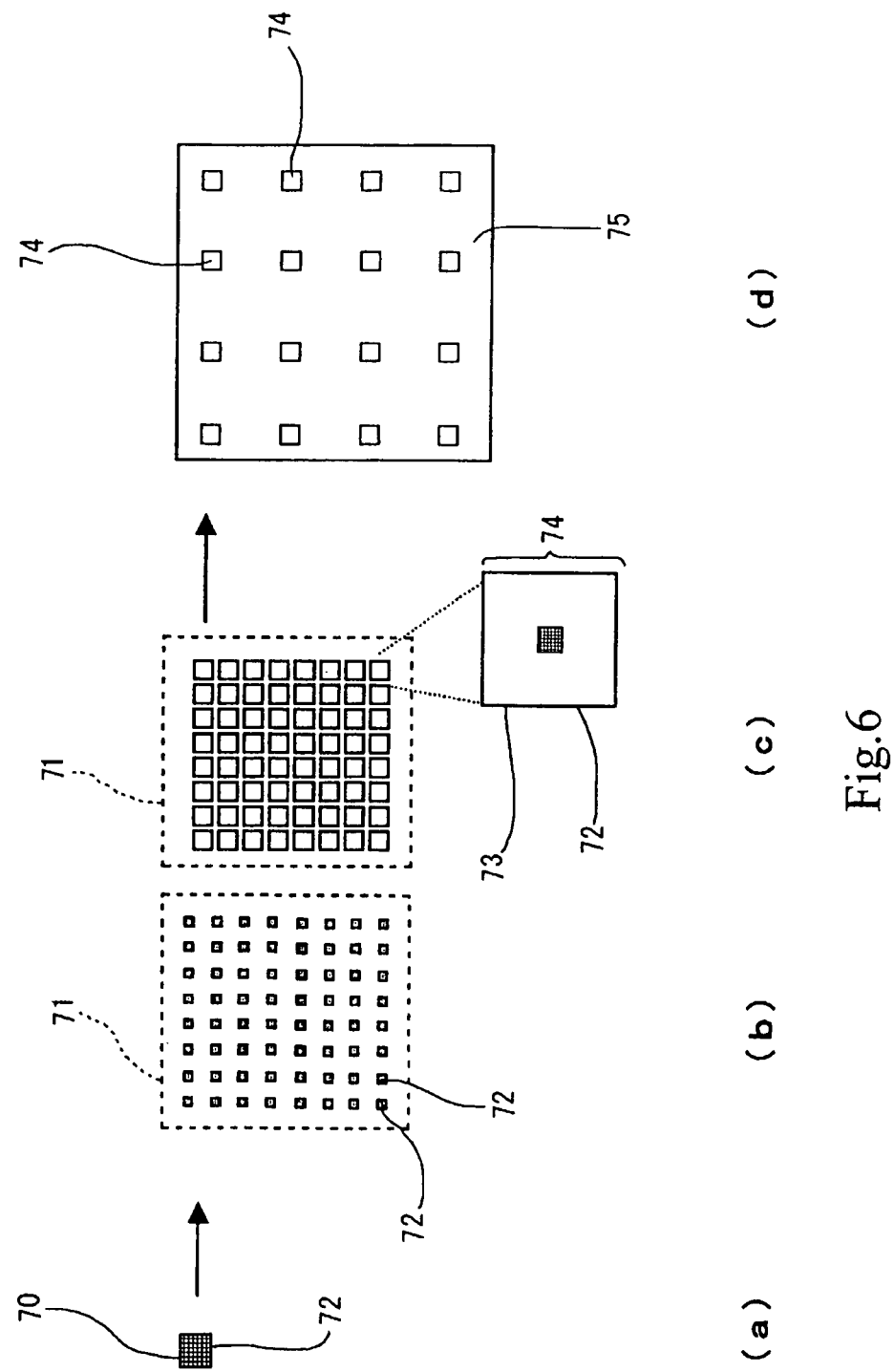
FIG. 6 is a manufacturing process flow diagram of manufacturing process of a method of manufacturing an image display device according to a fourth embodiment of the present invention.

FIG. 6 is a diagram illustrating basic processes of the two-stage enlargement transfer method. First, light emitting elements 72 are densely formed on a first substrate 70 shown in (a) of FIG. 6. By densely forming the light emitting elements, it is possible to increase the number of light emitting elements produced per substrate and thus reduce product cost. The first substrate 70 is one of various substrates allowing element formation, such for example as semiconductor wafers, glass substrates, silica glass substrates, sapphire substrates, and plastic substrates. The light emitting elements 72 may be formed directly on the first substrate 70 or may be formed by arranging light emitting elements formed on another substrate.

Next, as shown in (b) of FIG. 6, each of the light emitting elements 72 is transferred from the first substrate 70 to a temporary holding member 71 indicated by a broken line in the figure. Each of the light emitting elements 72 is held on the temporary holding member 71. At this point, the adjacent light emitting elements 72 are separated and arranged in a form of a matrix as shown in (b) of FIG. 6. That is, the light emitting elements 72 are transferred so that spaces between the light emitting elements are widened in an x-direction and spaces between the light emitting elements are widened also in a y-direction perpendicular to the x-direction. A spacing interval in this case is not specifically limited; the interval can be set in consideration of formation of resin parts and formation of electrode pads in subsequent processes, for example. When transferred from the first substrate 70 onto the temporary holding member 71, all the elements on the first substrate 70 can be separated and transferred. In this case, it suffices for the size of the temporary holding member 71 to be equal to or larger than a size obtained by multiplying the number of light emitting elements 72 (in each of the x-direction and the y-direction) arranged in the form of a matrix by the spacing interval. Also, it is possible to separate and transfer part of the light emitting elements on the first substrate 70 onto the temporary holding member 71.

As shown in (c) of FIG. 6, since the light emitting elements 72 present on the temporary holding member 71 are separated after the first transfer process, resin coating and formation of electrode pads around the elements are performed. The resin coating around the elements is formed to facilitate the formation of the electrode pads and facilitate handling in the subsequent second transfer process, for example. The electrode pads are formed in a relatively large size so as to prevent faulty wiring at the time of final wiring performed after the subsequent second transfer process, as will be described later. Incidentally, the electrode pads are not shown in (c) of FIG. 6. A resin-formed chip 74 is formed by coating the periphery of each of the light emitting elements 72 with a resin 73. The resin coating around the elements can also be performed such that a plurality of light emitting elements 72 are included in one resin-formed chip 74.

Next, as shown in (d) of FIG. 6, the second transfer process is carried out. In the second transfer process, the light emitting elements 72 arranged in the form of a matrix on the temporary holding member 71 are transferred onto a second substrate 75 so as to be further separated while included in the resin-formed chips 74. Also in the second transfer process, adjacent light emitting elements 72 are separated while included in the resin-formed chips 74 and arranged in the form of a matrix, as shown in (d) of FIG. 6. That is, the elements 62 are transferred so that spaces between the elements are widened in an x-direction and also spaces between the light emitting elements are widened in a y-direction perpendicular to the x-direction. Supposing that positions of the light emitting elements arranged by the second transfer process correspond to sub-pixels of a final product of the image display device, a substantially integral multiple of an original pitch between the light emitting elements 72 is a pitch of the light emitting elements 72 arranged by the second transfer process. Letting n be a ratio of enlargement of the pitch of the light emitting elements 72 separated on the temporary holding member 71 from the first substrate 70 and letting m be a ratio of enlargement of the pitch of the light emitting elements 72 separated on the second substrate 75 from the temporary holding member 71, a value E of the substantially integral multiple is expressed by E=n×m. It suffices for each of the ratios n and m of enlargement to be an integer.

Each of the light emitting elements 72 separated on the second substrate 75 in a state of being included in the resin-formed chips 74 is provided with wiring. At this time, the wiring is provided while minimizing connection defects using the previously formed electrode pads and the like. When the light emitting elements 72 are light emitting diodes, for example, the wiring includes wiring to a p-electrode and an n-electrode. Thus, the light emitting elements are transferred for enlargement from the first substrate 70 where the light emitting elements are formed to the image display device or a unit panel forming the image display device, whereby the image display device can be manufactured easily using the light emitting elements fabricated on the first substrate at a high density. When light emitting elements emitting light of different colors are disposed on the device substrate of the image display device, the light emitting elements can be arranged at a predetermined element pitch by changing the position of light emitting elements emitting light of each light emission color being transferred to the device substrate or the unit panel.

In the two-stage enlargement transfer method illustrated in FIG. 6, the formation of electrode pads, resin coating and the like can be performed using increased spaces after the first transfer and wiring is provided after the second transfer. The wiring is provided while minimizing connection defects using the previously formed electrode pads and the like. Hence, the yield of the image display device can be improved. Further, there are two processes for increasing distance between elements in the two-stage enlargement transfer method in this example. By performing such enlargement transfer in a plurality of processes for increasing distance between elements, it is possible in practice to reduce the number of transfers.

Figure 7:
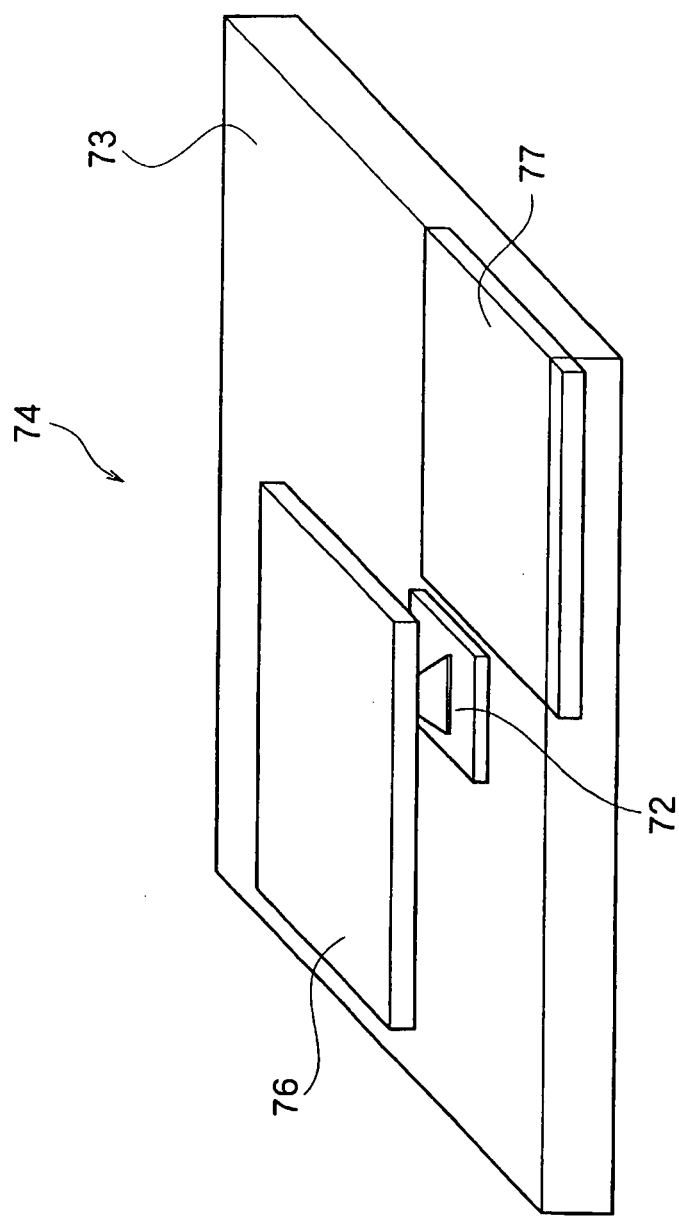
FIG. 7 is a schematic perspective view of a structure of a resin-formed chip in the method of manufacturing the image display device according to the fourth embodiment of the present invention.
Figure 8:
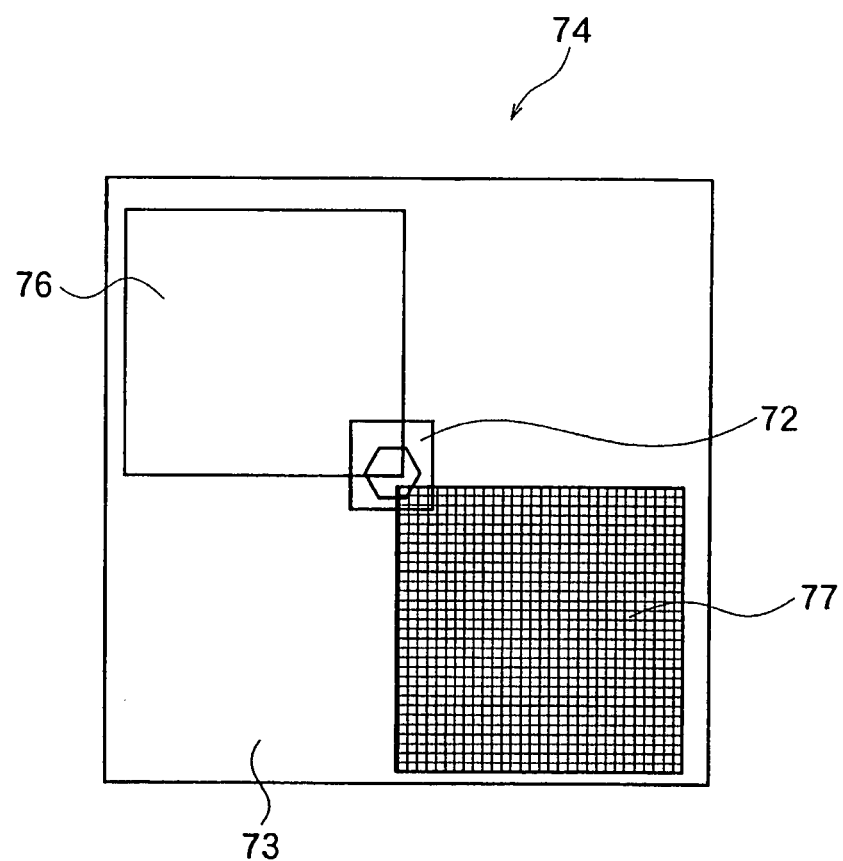
FIG. 8 is a schematic plan structural view of the structure of the resin-formed chip in the method of manufacturing the image display device according to the fourth embodiment of the present invention.

The resin-formed chip 74 used as a display element in the two-stage enlargement transfer method will next be described. As shown in FIG. 7 and FIG. 8, the resin-formed chip 74 has a main surface of a substantially square shape on a substantially flat substrate. The shape of the resin-formed chip 74 is formed by curing the resin 73. Specifically, the shape is obtained by coating an uncured resin over the entire surface so as to include each light emitting element 72 and cutting an edge portion by dicing or the like after curing the resin. In the fourth embodiment, description will be made of a pyramid-shaped light emitting diode emitting blue or green light formed by using a nitride semiconductor. However, the transfer method of the fourth embodiment can also be used for a planar light emitting diode formed as a red light emitting diode by an aluminum gallium arsenide or indium aluminum gallium phosphide based semiconductor grown on a gallium arsenide substrate.

Electrode pads 76 and 77 are formed on an upper surface side and a lower surface side, respectively, of the resin 73 in a shape of a substantially flat board. The formation of the electrode pads 76 and 77 is performed by forming a conductive layer such as a metallic layer or a polycrystalline silicon layer as a material for the electrode pads 76 and 77 over the entire surface and patterning the conductive layer into a required electrode shape by a photolithography technique. These electrode pads 76 and 77 are formed so as to be connected to the p-electrode and n-electrode, respectively, of the light emitting element 72, and a via hole or the like is formed in the resin 73 when necessary.

In this case, the electrode pads 76 and 77 are formed on the upper surface side and the lower surface side, respectively, of the resin-formed chip 74. However, both the electrode pads can be formed on one of the surfaces. The electrode pads 76 and 77 are displaced from each other on the flat substrate so as not to overlap each other when a contact is provided from an upper side at the time of final wiring formation. The shape of the electrode pads 76 and 77 is not limited to the square shape, and may be another shape.

By forming such a resin-formed chip 74, the periphery of the light emitting element 72 is coated with the resin 73. The electrode pads 76 and 77 can be formed with good precision by flattening, and the electrode pads 76 and 77 can be extended over a wider area than the light emitting element 72. Therefore, when proceeding with the transfer in the subsequent second transfer process with a suction jig, handling is made easier. As will be described later, final wiring is performed after the subsequent second transfer process. Hence, by performing wiring using the electrode pads 76 and 77 of a relatively large size, faulty wiring is prevented.

Figure 9:
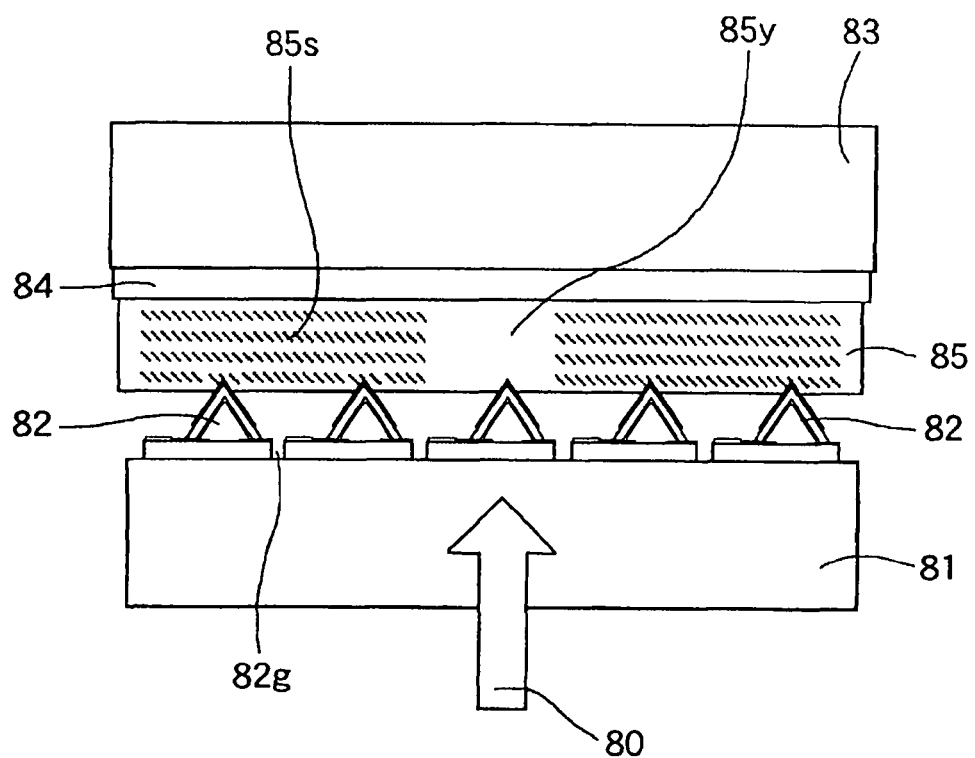
FIG. 9 is a process sectional view of a laser irradiation process in the method of manufacturing the image display device according to the fourth embodiment of the present invention.

A concrete method of arrangement of the resin-formed chips 74 including the light emitting elements 72 will next be described. As shown in FIG. 9, a plurality of light emitting diodes 82 are formed as light emitting elements in a form of a matrix on a main surface of a first substrate 81. As material for forming the first substrate 81, a material having a high transmissivity for a wavelength of a laser to be applied to the light emitting diodes 82 such as a sapphire substrate is used. P-electrodes and the like are formed in the light emitting diodes 82 but final wiring is not performed yet. Grooves 82g for isolation between elements are formed, so that the individual light emitting diodes 82 can be separated. The grooves 82g are formed by reactive ion etching, for example. Such a first substrate 81 is opposed to a temporary holding member 83 to perform selective transfer as shown in FIG. 9.

A detachment layer 84 and an adhesive layer 85 are formed as two layers on a surface of the temporary holding member 83 which surface is opposed to the first substrate 81. As an example of the temporary holding member 83, a glass substrate, a silica glass substrate, a plastic substrate or the like can be used. As an example of the detachment layer 84 on the temporary holding member 83, a fluorine coating, silicone resin, water-soluble adhesive (for example polyvinyl alcohol: PVA), polyimide or the like can be used. As the adhesive layer 85 of the temporary holding member 83, a layer formed of either one of an ultraviolet (UV) curing adhesive, a thermosetting adhesive, and a thermoplastic adhesive can be used.

The adhesive layer 85 of the temporary holding member 83 is controlled such that cured regions 85s and an uncured region 85y are intermingled, and is adjusted such that a light emitting diode 82 to be selectively transferred is placed in the uncured region 85y. For controlling such that the cured regions 85s and the uncured region 85y are intermingled, it suffices to subject a UV curing adhesive, for example, to selective UV exposure by an exposing device so that the region for transferring the light emitting diode 82 is in an uncured state and the other regions are in a cured state. After such an alignment, the light emitting diode 82 in the position for transfer is irradiated with a laser 80 from the undersurface of the first substrate 81, whereby the light emitting diode 82 is detached from the first substrate 81 by using laser ablation. A GaN based light emitting diode 82 can be detached relatively easily because the GaN based light emitting diode 82 is resolved into Ga as a metal and nitrogen at an interface between the light emitting diode 82 and the sapphire. As a laser for irradiation, an excimer laser, a harmonic YAG laser or the like is used.

The light emitting diode 82 subjected to selective irradiation is separated at an interface between the GaN layer and the first substrate 81 by the detachment using laser ablation, and transferred such that the p-electrode portion sticks in the adhesive layer 85 on the opposite side. Since parts of the adhesive layer 85 that correspond to other light emitting diodes 82 in regions not irradiated with the laser are the cured regions 85s and the other light emitting diodes 82 are not irradiated with the laser, the other light emitting diodes 82 are not transferred to the temporary holding member 83 side.

Figure 10:
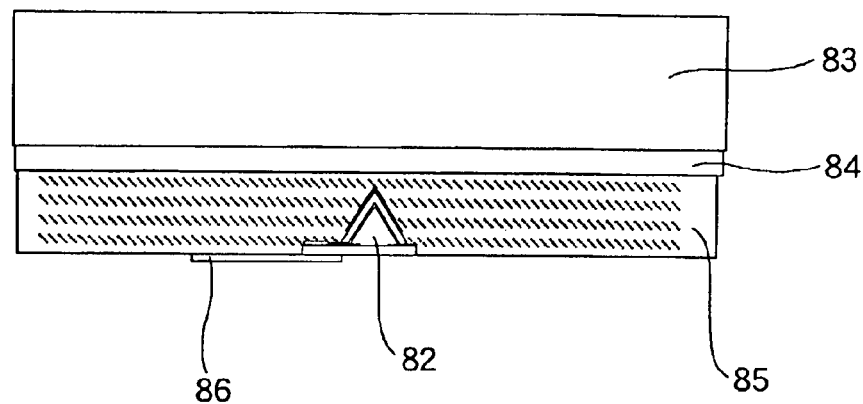
FIG. 10 is a process sectional view of a process of holding a light emitting element in the method of manufacturing the image display device according to the fourth embodiment of the present invention.

In a state in which the light emitting diode 82 is held by the adhesive layer 85 of the temporary holding member 83, the undersurface of the light emitting diode 82 is an n-electrode side (cathode electrode side). The undersurface of the light emitting diode 82 is cleaned so as to remove the resin (adhesive). Therefore, when an electrode pad 86 is formed as shown in FIG. 10, the electrode pad 86 is electrically connected to the undersurface of the light emitting diode 82.

As an example of the cleaning of the adhesive layer 85, the adhesive layer 85 is cleaned by etching the adhesive resin with oxygen plasma and UV ozone irradiation. In addition, when the GaN based light emitting diode is detached by the laser from the first substrate 81 formed by a sapphire substrate, Ga is deposited on the detached surface, and therefore Ga needs to be etched. The etching is performed with an NaOH aqueous solution or a dilute nitric acid. Thereafter the electrode pad 86 is patterned. As the electrode pad 86, a transparent electrode (ITO or ZnO base or the like) or a material such as Ti/Al/Pt/Au can be used. In the case of the transparent electrode, because the transparent electrode does not block emitted light even when the transparent electrode covers a large area of the undersurface of the light emitting diode, a large electrode can be formed with a low patterning accuracy, and therefore the patterning process is facilitated.

After the formation of the electrode pad 86, the adhesive layer 85 cured for each display element which layer includes a plurality of light emitting diodes 82 is cut by a dicing process to thereby form a resin-formed chip corresponding to each light emitting diode 82. The dicing process is carried out by dicing using mechanical means or laser dicing using a laser beam. A cutting width of the dicing depends on the size of the light emitting diode 82 covered in the adhesive layer 85 within a pixel of the image display device. However, when cutting of a narrow width of for example 20 μm or less is required, laser machining using the laser beam is needed. At this time, an excimer laser, a harmonic YAG laser, a carbon dioxide gas laser or the like can be used as the laser beam.

Figure 11:
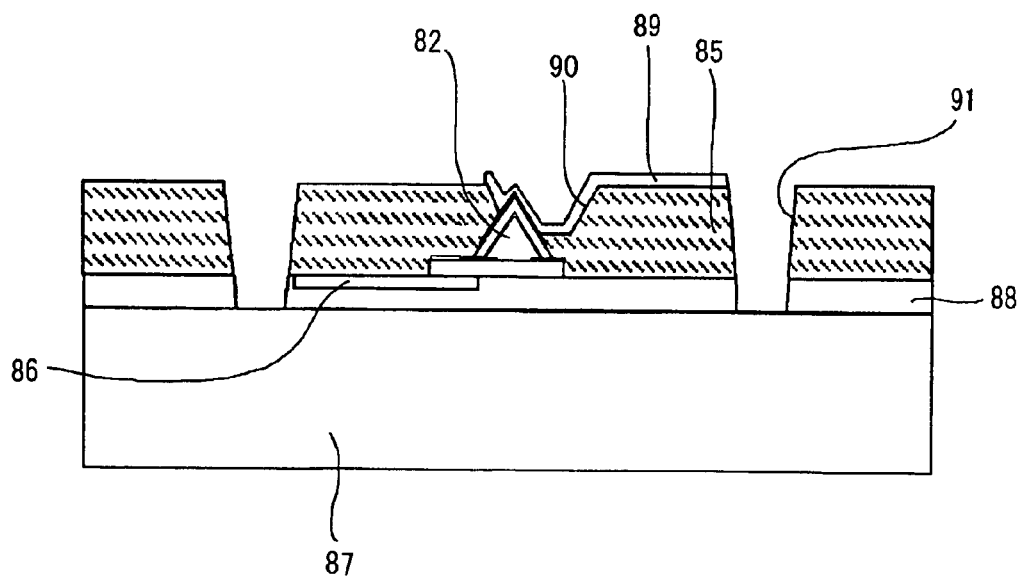
FIG. 11 is a process sectional view of an element isolation process in the method of manufacturing the image display device according to the fourth embodiment of the present invention.

FIG. 11 shows a state resulting from transferring the light emitting diode 82 from the temporary holding member 83 to a second temporary holding member 87, forming an anode side electrode pad 89 after forming a via hole 90 on an anode electrode (p-electrode) side, and dicing the adhesive layer 85 formed by the resin. As a result of the dicing, an element isolation groove 91 is formed, whereby the light emitting diode 82 is divided into each of a plurality of elements. Since element isolation grooves 91 separate a group of light emitting diodes 82 in the form of a matrix, the element isolation grooves 91 as a plane pattern comprise a plurality of parallel lines extended longitudinally and laterally. A surface of the second temporary holding member 87 is exposed at bottoms of the element isolation grooves 91. The second temporary holding member 87 is for example a so-called dicing sheet formed by coating a plastic substrate with a UV adhesive, and a dicing sheet that decreases in adhesive power when irradiated with UV can be used.

Incidentally, at the time of the above-mentioned transfer, an excimer laser is applied from the undersurface of the temporary holding member 83 having the detachment layer 84 formed thereon. Thereby, in a case where a polyimide is formed as the detachment layer 84, for example, detachment is caused by polyimide ablation, and then each light emitting diode 82 is transferred to the second temporary holding member 87 side. Further, as an example of a process for forming the anode electrode pad 89, the surface of the adhesive layer 85 is etched by oxygen plasma until the p-electrode on a surface of the light emitting diode 82 is exposed. The via hole 90 can be formed by using an excimer laser, a harmonic YAG laser, or a carbon dioxide gas laser. The anode side electrode pad 89 is formed by Ni/Pt/Au or the like.

Next, display elements including a plurality of light emitting diodes 82 are detached from the second temporary holding member 87 by using mechanical means. In this case, a detachment layer 88 is formed on the second temporary holding member 87. The detachment layer 88 can be formed by using for example a fluorine coating, silicone resin, water-soluble adhesive (for example PVA), polyimide or the like. A YAG third harmonic laser, for example, is applied from the underside of the second temporary holding member 87 having the detachment layer 88 formed thereon. Thereby, in a case where a polyimide, for example, is formed as the detachment layer 88, detachment is caused by polyimide ablation at an interface between the polyimide and a quartz substrate, and therefore each light emitting diode 82 can be readily detached from the second temporary holding member 87 by the mechanical means.

Figure 12:
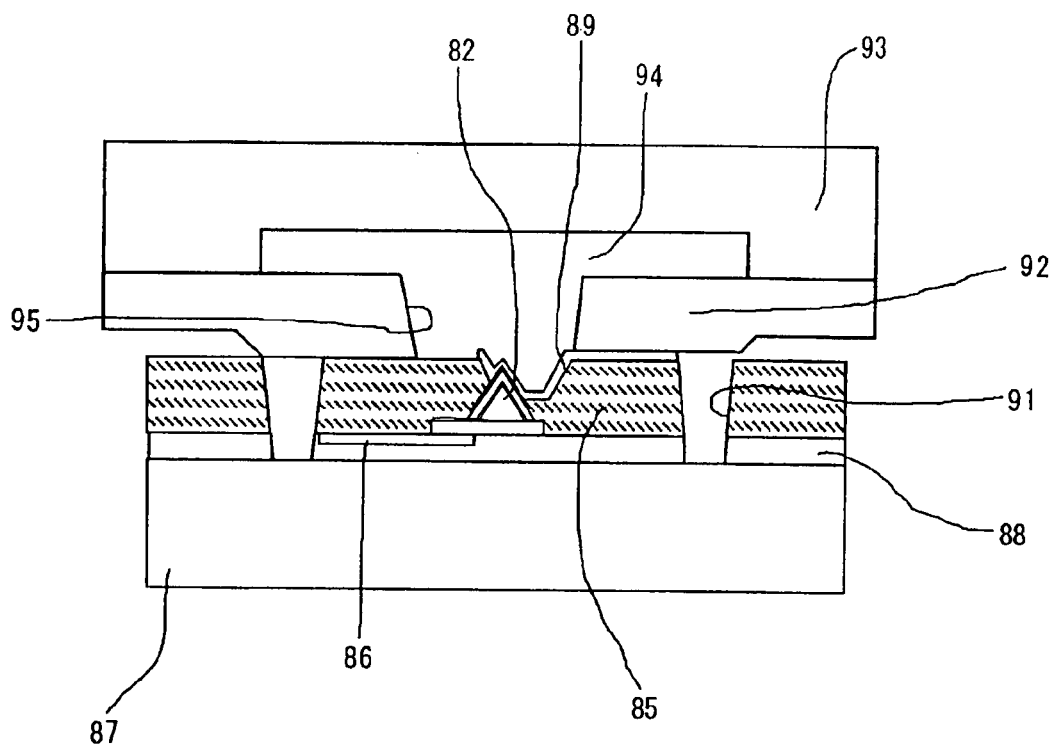
FIG. 12 is a process sectional view of a transfer process in the method of manufacturing the image display device according to the fourth embodiment of the present invention.

FIG. 12 shows the light emitting diode 82 arranged on the second temporary holding member 87 being picked up by a suction device 93. The light emitting diode 82 in a resin-formed chip is picked up by the suction device 93, and mounted on a device substrate of the image display device or a substrate forming a unit panel. Suction holes 95 in this case are opened in a form of a matrix so as to suck multiple light emitting diodes 82 at the same time. A member produced by Ni electroforming or formed by hole processing by etching a metallic plate 92 of stainless steel (SUS) or the like, for example, is used to form the suction holes 95. A suction chamber 94 is formed on an inner side of a suction hole 95 of the metallic plate 92. The light emitting diode 82 can be sucked up by controlling the suction chamber 94 to a negative pressure. The light emitting diode 82 in this stage is covered in the resin 73, and an upper surface of the resin 73 is substantially flattened. It is therefore possible to easily proceed with selective suction by the suction device 93.

In the method of arranging resin-formed chips including light emitting elements as described above, distance between elements is already increased when the light emitting diode 82 is held by the temporary holding member 83, and the electrode pads 86 and 89 of a relatively large size and the like can be provided using the widened space. Wiring is performed using the electrode pads 86 and 89 of the relatively large size. Therefore, wiring can be formed readily even when a final device size is considerably larger than an element size. In addition, in the method of arranging light emitting elements in this example, the periphery of the light emitting diode 82 is coated with the cured adhesive layer 85, the electrode pads 86 and 89 can be formed with good precision by flattening, and the electrode pads 86 and 89 can be extended over a wider area than the element. Therefore, when proceeding with the subsequent transfer or the like with a suction jig, handling is made easier. Further, by carrying out the above-described transfer processes for each of light emitting elements emitting light of different colors, it is possible to readily arrange the light emitting elements forming sub-pixels at a predetermined element pitch.

INDUSTRIAL APPLICABILITY

An image display device according to the present invention can provide an image display device that makes it possible to reduce the number of sub-pixels and form pixels at a high density by sharing respective sub-pixels between pixels and thus realize high picture quality and reduction in the number of parts. Further, it is possible to provide an image display device capable of displaying a high-contrast image without being affected by extraneous light even outdoors by suppressing reflection of light on an image display surface. Manufacturing cost can be reduced by decreasing the number of parts.

Also, an image display device according to the present invention can continue image display without the sub-pixel not driven normally being replaced with a non-defective product, thus providing a high yield. The manufacturing process is made easier, and thereby manufacturing cost can be reduced. In addition, by transferring minute light emitting elements fabricated at a high density to a substrate while increasing distance between the elements and thereby mounting the light emitting elements on the substrate, it is possible to fabricate an image display device with a higher efficiency and reduce cost required to fabricate the light emitting elements. Further, the light emitting elements, which are of a minute size, can be provided on a wiring substrate at a high density. Further, the light emitting elements are mounted on the wiring substrate after the individual light emitting elements are completed. Therefore a good yield is obtained and it is easy to increase screen size.

The invention claimed is:

1. An image display device formed by arranging, in a form of a matrix, unit panels on which sub-pixels emitting colors different from each other are formed, said image display device characterized in that:
    a first unit panel of the unit panels comprises a first pixel comprising first, second and third sub-pixels of different respective first, second, and third colors, and a second pixel adjacent to the first pixel and directly adjacent a first edge of the unit panel, the second pixel comprising a fourth sub-pixel of the first color, a fifth sub-pixel of the second color, and the third sub-pixel, which is shared with the first pixel,
    wherein the third sub-pixel is driven by time division,
    wherein the second color is of the highest visibility relative to the first and third colors and wherein the fifth sub-pixel of the second color is positioned closest to the first edge relative to the fourth and third sub-pixels, and
    wherein each of the sub-pixels of the first pixel and the second pixel lie in the same plane.

2. An image display device formed by arranging, in a form of a matrix, unit panels on which sub-pixels emitting colors different from each other are formed, said image display device comprising:
    a first unit panel of the unit panels comprising a first portion of a first pixel directly adjacent a first edge of the first unit panel, the first portion of the first pixel comprising a first sub-pixel of a first color and a second sub-pixel of a second color; and
    a second unit panel of the unit panels, the second unit panel being separate from the first unit panel and comprising a second portion of the first pixel, the second portion of the first pixel comprising a shared third sub-pixel of a third color, and a second pixel directly adjacent to a second edge of the second unit panel, the second pixel comprising a fourth sub-pixel of the first color, a fifth sub-pixel of the second color and the shared third sub-pixel of a third color;
    wherein the third sub-pixel is driven by time division so as to be shared between the first and second pixels;
    wherein the third sub-pixel is displaced from the second edge of the second unit panel by at least one sub-pixel; and
    wherein each of the sub-pixels of the first pixel and the second pixel lie in the same plane.

3. The image display device as claimed in claim 2, characterized in that:
    said shared third sub-pixel emits a color of a low visibility among said sub-pixels of the first and second pixels.

4. The image display device as claimed in claim 2, characterized in that:
    said third color is blue.

5. The image display device as claimed in claim 2, characterized in that:
    sub-pixels of the third color are thinned out at an edge portion of the first unit panel.

6. The image display device as claimed in claim 2, characterized in that:
    each of said first, second, third, fourth, fifth and sixth sub-pixels has a light emitting element.

7. The image display device as claimed in claim 6, characterized in that:
    said light emitting element is a light emitting diode.

8. The image display device of claim 1, wherein sub-pixels of the first pixel are driven so as to be illuminated simultaneously and sub-pixels of the second pixel are driven so as to be illuminated simultaneously.

9. The image display device of claim 1, wherein the image display device is configured such that for pixels of the unit panel that are not directly adjacent the first edge, sub-pixel sharing does not occur.

10. The image display device of claim 2, wherein the second color is of the highest visibility relative to the first and third colors and wherein the second sub-pixel of the second color is positioned closer to the first edge than the first sub-pixel.

11. The image display device of claim 2, wherein the image display device is configured such that for pixels of the first unit panel that are not directly adjacent the first edge, sub-pixel sharing does not occur.

12. The image display device of claim 2, further comprising circuitry configured to drive the first pixel separately from the second pixel.

* * * * *